United States Patent [19]

Kurogi et al.

[11] Patent Number: 4,637,127
[45] Date of Patent: Jan. 20, 1987

[54] METHOD FOR MANUFACTURING A SEMICONDUCTOR DEVICE

[75] Inventors: Yukinori Kurogi; Nobuhiro Endo; Kohetsu Tanno, all of Tokyo, Japan

[73] Assignee: Nippon Electric Co., Ltd., Japan

[21] Appl. No.: 395,110

[22] Filed: Jul. 6, 1982

[30] Foreign Application Priority Data

| Jul. 7, 1981 | [JP] | Japan | 56-105882 |
| Jul. 7, 1981 | [JP] | Japan | 56-105883 |
| Jul. 7, 1981 | [JP] | Japan | 56-105884 |
| Jul. 7, 1981 | [JP] | Japan | 56-105885 |
| Jul. 7, 1981 | [JP] | Japan | 56-105886 |
| Jul. 7, 1981 | [JP] | Japan | 56-105888 |
| Sep. 29, 1981 | [JP] | Japan | 56-154376 |
| Sep. 29, 1981 | [JP] | Japan | 56-154377 |
| Sep. 29, 1981 | [JP] | Japan | 56-154378 |
| Oct. 1, 1981 | [JP] | Japan | 56-156683 |
| Oct. 1, 1981 | [JP] | Japan | 56-156684 |

[51] Int. Cl.[4] .................... H01L 21/205; H01L 21/76
[52] U.S. Cl. .................... 29/576 E; 148/175; 148/DIG. 26; 148/DIG. 27; 156/612; 156/613; 156/614; 427/85; 427/86
[58] Field of Search ..... 29/576 E; 148/175, DIG. 26, 148/DIG. 27; 156/612, 613, 614; 427/85, 86

[56] References Cited

U.S. PATENT DOCUMENTS

| 3,574,008 | 4/1971 | Rice | 148/DIG. 26 X |
| 3,624,150 | 1/1972 | Horn | 148/DIG. 26 X |
| 3,661,637 | 5/1972 | Sirtl | 148/DIG. 27 X |
| 4,462,847 | 7/1984 | Thompson et al. | 148/175 X |

OTHER PUBLICATIONS

Muench, W. V., "Producing Semiconductor Devices by Oriented Lateral Overgrowth", in *IBM Tech. Disclosure Bull.*, vol. 10, No. 10, 3-1968, pp. 1469-1470.

Rai-Choudhury, P., et al, "Selective Growth of Epitaxial Silicon and Gallium Arsenide", in *J. Electrochem. Soc.:Sol. State. Sci.*, 1-1978, pp. 107-110.

Duchemin, M. J., et al, "Kinetics of Silicon Growth Under Low Hydrogen Pressure", in *J. Electrochem. Soc.:Sol. State Sci. and Tech.*, 4-1978, pp. 637-644.

Krullman, E., et al, "Low-Pressure Silicon Epitaxy", in *IEEE Trans. on Electron Devices*, vol. ED-29, No. 4, 4-1982, pp. 491-497.

"Epitaxial Deposition of Silicon in Deep Grooves", J. Electrochem Soc.: Solid-State Science and Technology, Dec., 1975, pp. 1066-1071.

"Selective Silicon Epitaxy and Orientation Dependence of Growth", J. Electrochem Soc.: Solid-State Science and Technology, May/73, pp. 664-648.

"Crystallographic Orientation of Silicon on an Amorphous Substrate Using an Artificial Surface-Relief Grating and Laser Crystallization", Appl. Phys. Lett. 35(1) Jul., 1979, pp. 71-74.

"SI Bridging Epitaxy From SI Windows Onto SiO2, By Q-Switched Ruby Laser Pulse Annealing", Japanese Journal of Applied Physics, vol. 19, No. 1, Jan., 1980, pp. L23-26.

Primary Examiner—Brian E. Hearn
Assistant Examiner—John T. Callahan
Attorney, Agent, or Firm—Laff, Whitesel, Conte & Saret

[57] ABSTRACT

A method of epitaxying layers on a semiconductor substrate through apertures in an insulating layer formed on a substrate. The layers are grown from the substrate and extend on the insulating layer by reacting dichlorosilane, hydrogen chloride and a carrier gas flow in a chamber under reduced pressure. The layers are used for semiconductors device formation.

7 Claims, 22 Drawing Figures

METHOD FOR MANUFACTURING A SEMICONDUCTOR DEVICE

BACKGROUND OF THE INVENTION

The present invention relates to a semiconductor device and a method for manufacturing it, and more particularly to a method for selectively growing a flat, smooth silicon epitaxial layer on a single crystal semiconductor substrate having an insulating film at predetermined locations on its major surface, and to a semiconductor device having circuit elements formed in such a silicon epitaxial layer.

For a semiconductor device which must have a high density and a high operation speed, the problems of an isolating structure positioned between active elements and of a parasitic capacitance become important. Heretofore, circuit elements have been isolated from each other, for instance, by a method of partially oxidizing a semiconductor substrate in which the circuit elements are formed and by a method of forming isolation regions by making use of an impurity.

However, these known methods are not suitable for high density circuit integration because the gap distances between adjacent active regions must be made relatively large.

In addition, a parasitic capacitance is produced by a PN junction between the bottom of an active element in a semiconductor substrate and the same semiconductor substrate. The capacitance creates a problem in increasing the operational speed.

The above-mentioned problem, can be solved by forming a silicon epitaxial layer (silicon monocrystalline layer) on an insulating film or an insulating substrate and by forming an element in this silicon epitaxial layer. To that end, heretofore, the technique of SOS (Silicon On Sapphire) has been available. However, the junction formed between a sapphire substrate and a silicon layer thereon is a heterojunction. Therefore, many lattice defects are present along the boundary face of the junction and those defects become a cause of leakage current.

On the other hand, a method of converting polycrystalline silicon into a monocrystalline silicon by means of a laser was proposed by M. W. Greis et al. in Applied Physics Letters Vol. 35, July 1979, pages 71 to 74. In more particular, a grating is formed periodically on silica ($SiO_2$), and polycrystalline silicon is deposited on the grating through a CVD (Chemical Vapor Deposition) process. Thereafter, as a result of melting by laser irradiation, recrystallization occurs from the grating into a monocrystalline silicon. However, this method involves many problems in a practical application such as problems with crystal grain sizes, a degree of conversion into a monocrystalline silicon, generation of lattice defects, etc.

The method of converting polycrystalline silicon into a monocrystalline silicon by laser irradiation was also proposed by Masao Tamura et al. in the Japanese Journal of Applied Physics, Vol. 19, No. 1, January 1980, pages L23 to L26. According to this method, a window is opened in a silicon dioxide film on a silicon single crystal substrate and polycrystalline silicon is deposited over the entire surface, through a CVD process. Thereafter, by laser irradiation recrystallization is attempted from the silicon substrate to convert the polycrystalline silicon on the silicon dioxide film into a monocrystalline silicon. However, this method also involves problems such as a degree of conversion into a monocrystalline silicon, crystal defects on the insulating film, etc. narrower, the method is not practical, since a recess having a depth of the order of the thickness of the silicon dioxide film is formed on the surface of the converted single crystal. Thus, the laser irradiation technique has not matured into a practically useful technique.

On the other hand, in the Journal of The Electrochemical Society: SOLID-STATE SCIENCE AND TECHNOLOGY, May 1973, pages 664 to 668 P. Rai-Choudhury et al. have proposed a method for selectively growing a silicon epitaxial layer (a monocrystalline layer). According to this method, silicon tetrachloride ($SiCl_4$) is grown under a reduced pressure ($7 \times 10^{-3}$ atm.). However, in this method making use of $SiCl_4$, the growing temperature of $SiCl_4$ becomes higher than 1100° C. Consequently, a silicon epitaxial layer having a good crystallinity cannot be obtained. In addition, because of the high growing temperature, stresses existing between the insulating film and the silicon epitaxial layer became large. Therefore, a leakage property of the elements produced in this epitaxial layer deteriorates. Furthermore, since the growing temperature is high, a redistribution of an impurity in the epitaxial layer is liable to occur. Hence, the operating characteristics of the produced elements fluctuate. Thus, this method is also poor in practical applications.

Another method for selectively growing a silicon epitaxial layer is proposed by R. K. Smeltzer in the Journal of the Electrochemical Society: SOLID-STATE SCIENCE AND TECHNOLOGY, December 1975, pages 1666 to 1671. According to this method, a groove of 10-20 $\mu$m width and about 100 $\mu$m depth is formed in a silicon substrate. An attempt is made to have a selective growth of a silicon epitaxial layer in the groove to fill up the groove. In this method, as a source of silicon, $SiH_4$, $SiHCl_3$, $SiH_2Cl_2$ or $SiCl_4$ is employed, and the silicon single crystal is grown at atmospheric pressure while adding HCl to the silicon source. Since, growth takes place at atmospheric pressure, there is a large pattern shift and facets are produced on a crystalline surface, resulting in an unevenness of the surface. In addition, in the method of growing at an atmospheric pressure, crystallization is not smooth and hence a uniform film thickness cannot be obtained.

Accordingly, even if an epitaxial layer were to be grown on an insulating film above a silicon substrate by making use of this method, it would be impossible to form an element in that epitaxial layer.

As described above, if a silicon epitaxial layer (a silicon monocrystalline layer) is grown on an insulating film according to the prior art techniques, a circuit element is difficult to form in that layer. Especially it is impossible to produce an insulated gate field effect transistor (hereinafter abbreviated as "IGFET"), for which a surface condition is very important, in a silicon epitaxial layer grown according to the prior art technique.

SUMMARY OF THE INVENTION

One object of the present invention is to provide a novel method for growing a silicon epitaxial layer which is free from the above-described shortcomings.

Another object of the present invention is to provide a semiconductor device in which at least a part of the circuit elements, preferably insulated gate field effect transistors, are produced in a silicon monocrystalline layer epitaxially grown on an insulating film along a major surface of a semiconductor substrate.

According to one feature of the present invention, a method for manufacturing a semiconductor device comprises the steps of preparing a silicon single crystal substrate having on its major surface an insulating film with an aperture or apertures selectively formed therein. A silicon epitaxial layer or layers are grown under a reduced pressure by making use of dichlorosilane ($SiH_2Cl_2$) as a silicon source and by introducing a hydrogen chloride (HCl) gas on the silicon substrate surface in the aperture or apertures and continuously on the insulating film.

If the growing temperature is high, the stress between the grown layers and the insulating film becomes large, resulting in degradation of a leakage property of the circuit elements produced in the layers. On the other hand, if the growing temperature is too low, crystallization into a single crystal becomes difficult. Accordingly, the growing temperature is preferably in the range of 850° C. to 1100° C., and the preferred range is 900° C. to 1000° C. The reduced pressure is preferably in the range of 1 to 200 Torr, and the more favored range is 20 to 100 Torr. Depending upon a mixing ratio of $SiH_2Cl_2$ to HCl, the growth speed varies. The growing speed also depends upon the proportions of the area of the insulating film on the charged wafer. The lower limit of the amount of HCl used is determined by the condition necessary for a selective growth. The upper limit is determined so that the growing speed is not negative. (At a negative growing speeds, etching occurs). Typically, the proportion is such that $SiH_2Cl_2$ occupies 0.05 to 1.0 mol% and HCl occupies 0.05 to 3.0 mol%, the remainder being hydrogen ($H_2$) which serves as a carrier gas. In practical applications, it is preferable to grow the silicon epitaxial monocrystalline layer up to the height of 0.5 to 4 $\mu$m from the surface of the insulating film and at a distance of 0.5 to 4 $\mu$m from the edge of the aperture.

When a plurality of apertures are formed in the insulating film, each silicon monocrystalline layer grown from respective aperture may be integrated with others on the insulating film to form a continuous, single monocrystalline layer. The aperture wall may be formed with a plurality of steps so that the surface of the silicon monocrystalline layer and the exposed surface of the insulating film become co-planar with each other. A silicon nitride film may be deposited on the wall of the aperture provided in the insulating film of silicon dioxide so that a better silicon monocrystalline layer will grow.

The epitaxial layer formed by the above-described method of the present invention is uniform, with an excellent crystallinity, and only a small stress between the grown layer and the insulating film. Moreover, a redistribution of an impurity seldom occurs through the layer, and the pattern shift is small, with less unevenness of the crystalline surface caused by facets. Accordingly, by using such a silicon epitaxial layer, circuit elements can be easily produced that have excellent leakage properties and small deviations in operating characteristics.

According to another aspect of the present invention, a semiconductor device comprises a silicon single crystal substrate, and an insulating film being provided on the major surface of the substrate. An aperture or apertures are formed in the insulating film to reach the substrate. A silicon monocrystalline layer maker contact with the substrate within the aperture and extending over the insulating film. An element region is formed within the silicon monocrystalline layer. The element region may be either the source or drain region of an IGFET or of a complementary insulated gate field effect transistor (hereinafter abbreviated as "CMOS"), and also of a junction type field effect transistor.

According to still another aspect of the present invention, a semiconductor device comprises a first element formed in a silicon single crystal substrate. An insulating layer is provided on the first element, with an aperture which reaches the substrate formed in the insulating layer. A silicon monocrystalline layer makes contact with the substrate within the aperture and extending on the insulating layer. A second element is formed in the silicon monocrystalline layer on the first element. The first element may be a first IGFET and the second element may be a second IGFET.

DETAILED DESCRIPTION OF THE PRIOR ART

Figure 1:
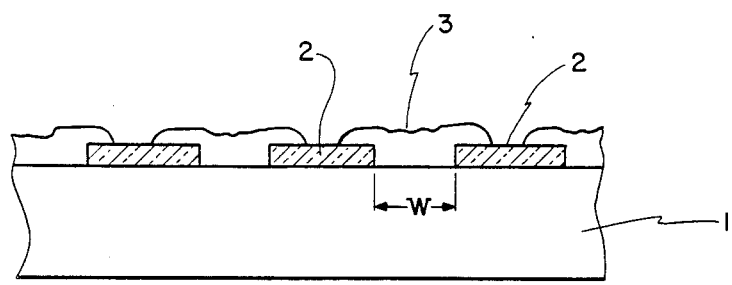
FIG. 1 is a cross-sectional view showing a silicon epitaxial layer formed according to the prior art technique.

A silicon epitaxial layer grown on a silicon substrate and an insulating film thereon, according to a prior art technique, is illustrated in FIG. 1. In the known process employed for growing the silicon epitaxial layer, a silicon substrate 1 of a (511) plane having a diameter of 3" is used. An insulating film ($SiO_2$ or $Si_3N_4$) is grown on the surface of the substrate 1, up to a thickness of about 3000 Å. Apertures having a width w of 0.5–3.0 $\mu$m are finely machined therein, as by an electron beam patterning technique or a dry etching technique.

This substrate 1 is set in a cylinder type of epitaxial growth furnace. While maintaining a substrate temperature at about 1200° C., prebaking is carried out for 15 minutes. Then, if the epitaxial growth is effected for about 1.5 minutes while holding the substrate temperature at 1080° C. under the conditions of an $H_2$ flow rate of 100 l/min., the $SiH_2Cl_2$ flow rate is 500 cc/min; an HCl flow rate is 1.5 l/min. and the pressure is 60 Torr (i.e. atmospheric pressure). A silicon monocrystalline layer 3 of about 5000 Å in thickness is grown.

The surface condition and the cross-section of the silicon monocrystalline layer 3 can be observed by means of a metallurgical microscope and a scanning election microscope (hereinafter abbreviated as "SEM").

The observed cross-section of the thus grown silicon epitaxial layer 3 is illustrated schematically in FIG. 1. As will be seen from this cross-sectional view, the surface condition of the grown silicon epitaxial layer is not flat and smooth, but is rough. Specifically, in the silicon monocrystalline layer grown under the atmospheric pressure, the deviation of surface heights is 20% or more with respect to the mean layer thickness as measured from the major surface of the substrate 1. In this case the mean layer thickness is 0.5 $\mu$m. Therefore, the surface roughness that is the deviation of the surface height is 0.1 $\mu$m or more. Therefore, by using the prior art technique, only a practically useless silicon epitaxial layer can be grown and useful semiconductor elements cannot be provided therein.

DESCRIPTION OF PREFERRED EMBODIMENTS

First Preferred Embodiments

Figure 2A:
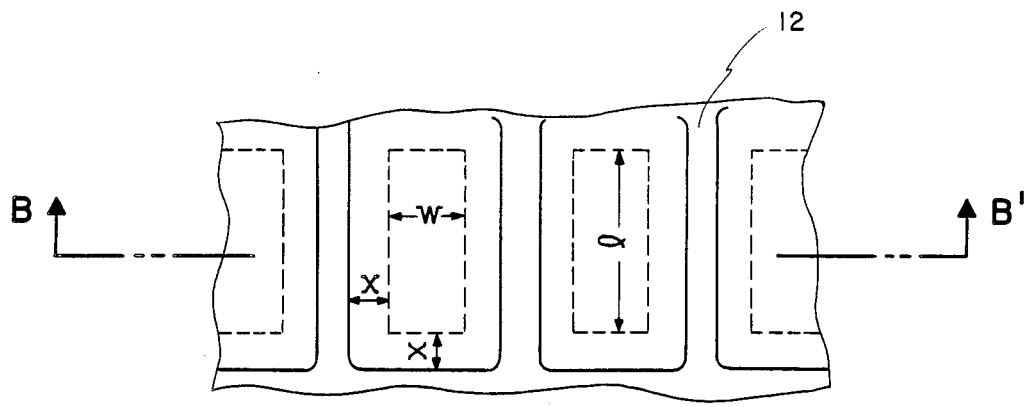
FIG. 2A is a plan view showing a first preferred embodiment of the present invention.
Figure 2B:
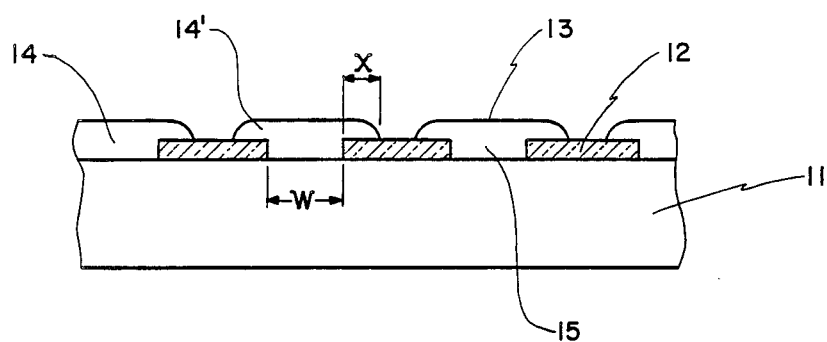
FIG. 2B is a cross-sectional view taken along line B—B' in FIG. 2A as viewed in the direction of arrows.

As shown in FIGS. 2A and 2B, an insulating ($SiO_2$ or $Si_3N_4$) film 12 of 0.5 $\mu$m thickness is formed on a silicon substrate 11 having a (511) plane and a diameter of 3". A plurality of apertures 15 having a length l of 3 $\mu$m and a width w of 0.5~3 $\mu$m (for instance, a width w of 1 $\mu$m) are opened in the insulating film 12 by an electron beam patterning technique and a dry etching technique.

This substrate is set in a cylinder type epitaxial growth furnace. While maintaining a substrate temperature at about 1200° C., prebaking is carried out for 15 minutes. Then, epitaxial growth is effected for about 6 minutes while holding the substrate temperature at 950° C., under the conditions of an $H_2$ flow rate of 100 l/min., an $SiH_2Cl_2$ flow rate of 500 cc/min., an HCl flow rate of 1.5 l/min. and a pressure of 50 Torr. A silicon monocrystalline layer 13 of about 1.2 $\mu$m in thickness is selectively grown.

The surface condition and the cross-section of the silicon monocrystalline layer 13 can be observed by means of a Marski's metallurgical microscope and an SEM. The results of such a observation are schematically shown in FIGS. 2A and 2B. The grown layer 13 extends over the insulating film 12 by a distance x of 0.7 $\mu$m, which is nearly equal to the height of the portion of the layer 13 projecting above the surface of the insulating film 12. As a result of an evaluation by X-rays, the portion 14' of the layer 13 grown above the insulating film 12 is confirmed to be a single crystal, like the portion 14 which is in and above the aperture 15. Furthermore, the surface condition of the Si epitaxial layer is favorably flat, and smooth.

The silicon monocrystalline layer which is grown under the reduced pressure condition has a small deviation of surface heights such as 5% or less, with respect to the mean layer thickness as measured from the major surface of the silicon substrate. In this case the mean layer thickness measured from the substrate is 1.2 $\mu$m. Therefore the deviation of the surface height is 0.06 $\mu$m or less.

As described above, if a selective silicon epitaxial layer is grown at a reduced pressure under an atmosphere of a $SiH_2Cl_2$-HCl-$H_2$ system, that has a layer flat and smooth surface, and also has a good crystallinity. Therefore, a useful and practical semiconductor element can be provided therein. In addition, the same effect can be expected in the silicon epitaxial layers even when a silicon substrate of a (111) plane or a (100) plane is employed, as well as the (511) plane. Because the epitaxial layer can even be grown over the insulating film 12 (as shown at 14' in FIG. 2), a source and a drain region of an IGFET can be formed in such regions. In such a structure, a generation of an abnormal current (latch-up) of a CMOS device can be prevented. Moreover, since a shortcoming of high density circuit integration can be eliminated and parasitic capacitance is reduced, a MOS or C-MOS device having a high operation speed can be formed at a high density.

Figure 3:
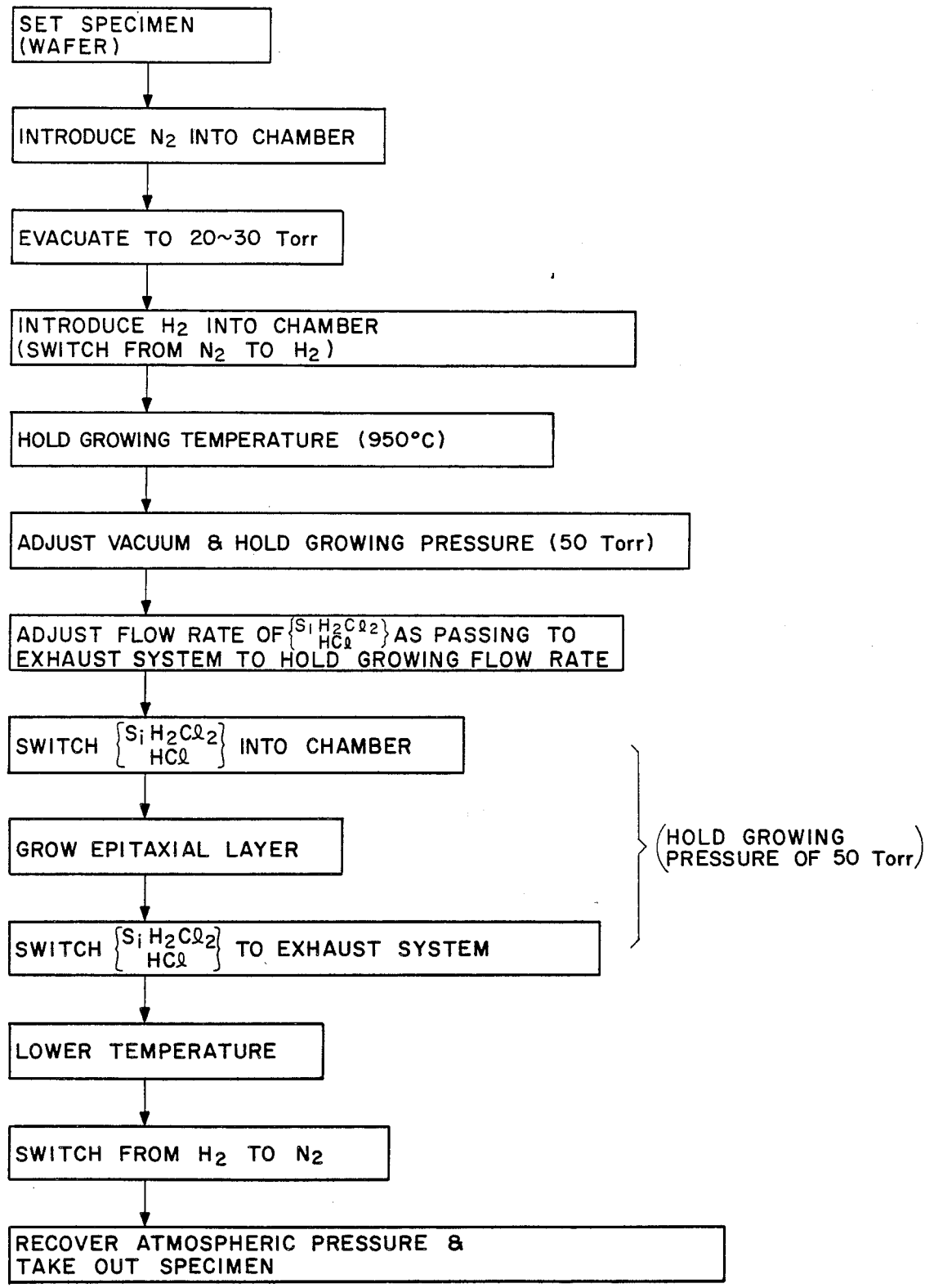
FIG. 3 is a flow chart showing the process of the first preferred embodiment.

FIG. 3 is a flow chart illustrating the process of growing an epitaxial layer, according to the above-described first embodiment.

Second Preferred Embodiment

Figure 4A:
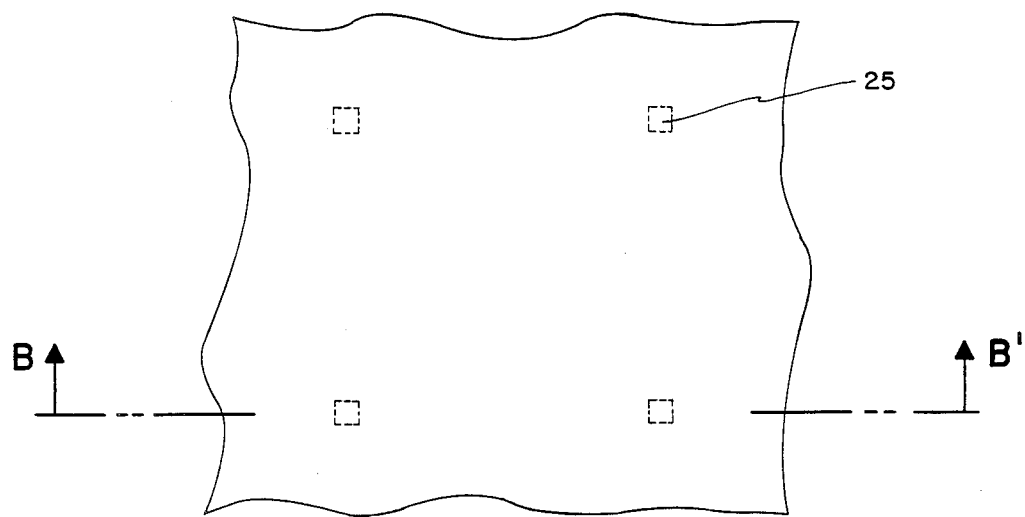
FIG. 4A is a plan view showing a second preferred embodiment of the present invention.
Figure 4B:
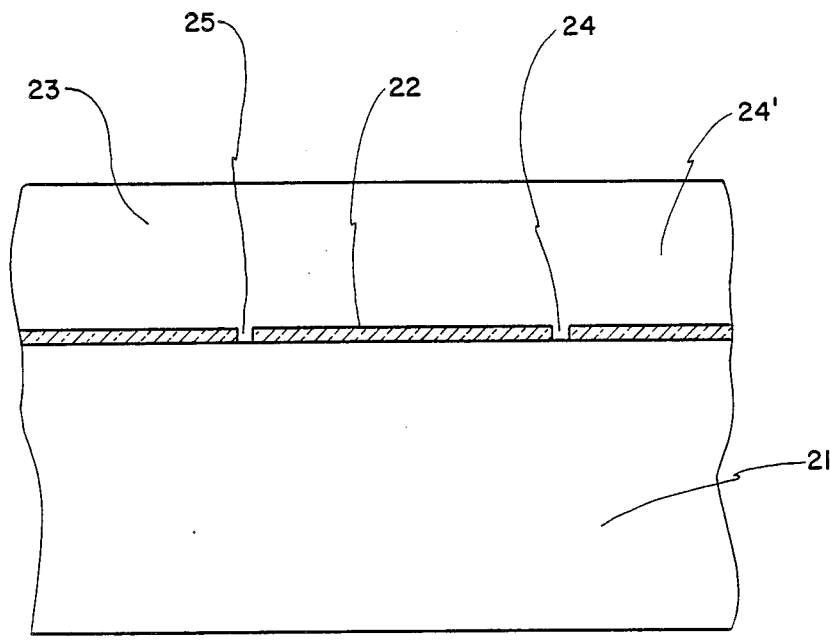
FIG. 4B is a cross-sectional view taken along line B—B' in FIG. 4A as viewed in the direction of arrows.

As shown in FIGS. 4A and 4B, a silicon dioxide film 22 of 0.5 $\mu$m thickness is formed on a silicon single crystal substrate 21 having a (111) plane. As shown in FIGS. 4A and 4B, a plurality of square apertures 25 of 1 $\mu$m, in edge length, are opened in this silicon dioxide film 22 to reach the substrate 21. The distance between opposed edges of respective adjacent apertures in the order of 2~10 $\mu$m, for example, 5 $\mu$m. This substrate is set in a reduced-pressure, epitaxial growth furnace. While maintaining a substrate temperature at 1200° C., prebaking is carried out for 15 minutes. Then epitaxial growth is effected while maintaining a substrate temperature at 1000° C. under the conditions of an $H_2$ flow rate of 100 l/min., an $SiH_2Cl_2$ flow rate of 500 cc/min., an HCl flow rate of 1.5 l/min. and a growing pressure of 80 Torr. A silicon epitaxial layer of 1~10 $\mu$m thickness is grown. For example, a layer of 5 $\mu$m thickness is grown as a result of growth for 10 minutes under the above stated conditions.

In this case, a growth of an epitaxial layer that is a silicon monocrystalline layer 23 commences from seed crystals consisting of the exposed portions of the silicon single crystal substrate 21. That is, it proceeds from the bottoms of the apertures 25, and after the grown layer has exceeded the height of the insulating film 22, it grows in the lateral directions along the top surface of the insulator film 22. When the thickness of the epitaxial layer 23 above the insulating film 22 become larger than one-half the lateral length of the insulating film 22 (FIG. 4B), the epitaxial layers grown from adjacent apertures connect to each other. Thus a flat and smooth epitaxial layer 23, having few crystal defects, can be grown on the surface of the substrate 21. As a matter of course, in this embodiment also, both the layer portion 24 above the aperture 25 and the layer portion 24' above the insulating film 22 consist of a single crystal which is similar the first embodiment.

As described above, according to the second preferred embodiment of the present invention, an insulating film is formed on a silicon single crystal substrate. Certain portions of the single crystal substrate are exposed, and an epitaxial layer is grown by making use of the exposed portions as seed crystals. The layer is grown over the entire surface of the insulating film. Since the effected growth is a reduced-pressure growth, an epitaxial crystal of high quality can be provided, with a flat and smooth surface and with few crystal defects. Therefore, the product can serve as a practical and useful semiconductor substrate. It is possible to form IGFET or bipolar elements in the single crystal layer on the insulating film. Therefore, a high speed device having a small parasitic capacitance and a high density can be realized.

Third Preferred Embodiment

Figure 5:
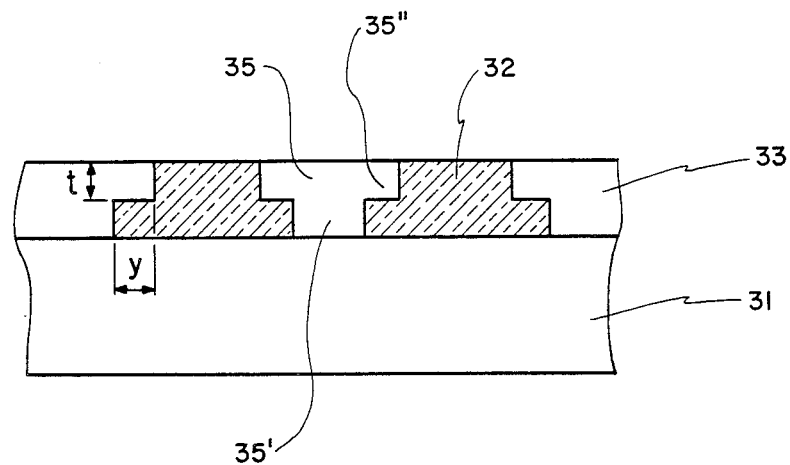
FIG. 5 is a cross-sectional view showing a third preferred embodiment of the present invention.

As shown FIG. 5, in an insulating film 32 is formed on a silicon single crystal substrate 31, having a (111) plane. A plurality of apertures 35 are opened, which is similar the first and second preferred embodiments. Each of these apertures 35 has a stepped structure comprising a lower portion 35' and an upper portion 35'', which is broader than the lower portion 35'. Here, it will be recalled that according to the first preferred embodiment, the surface of the silicon epitaxial layer and the surface of the exposed insulating film are not flush with each other. Accordingly, if wiring layers are formed on these surfaces, a problem would arise. On the other hand, according to the second preferred embodiment, a thick epitaxial layer is necessary in order to realize a flush surface of the epitaxial layer. According to this third preferred embodiment, the surface of the exposed insulating film 32 and the surface of the silicon epitaxial layer 33 can be made nearly flush with each other by designing the height and a lateral extension y of the step of the upper portion 35'' of the aperture 35 to have approximately equal dimensions, in the range of 0.5 to 2.0 μm. This is because a thickness of an epitaxial layer grown higher than the step of the insulating film is nearly equal to a length of extension thereof, on the insulating film. The silicon epitaxial layer 33 in this preferred embodiment can be grown through a process similar to that employed in the first or second preferred embodiments. Some of elements can be formed in the silicon epitaxial layer, on the stepped portion of the insulating film 32.

Fourth Preferred Embodiment

When appertures are formed in a silicon dioxide film and epitaxial growth of silicon according to the present invention is effected, depending upon the treatment conditions, an epitaxial layer portion sometimes makes contact with a lower portion of the side surface of the aperture and other times it is missing and a cavity is formed there. Such a defect is avoided, according to this preferred embodiment.

Figure 6:
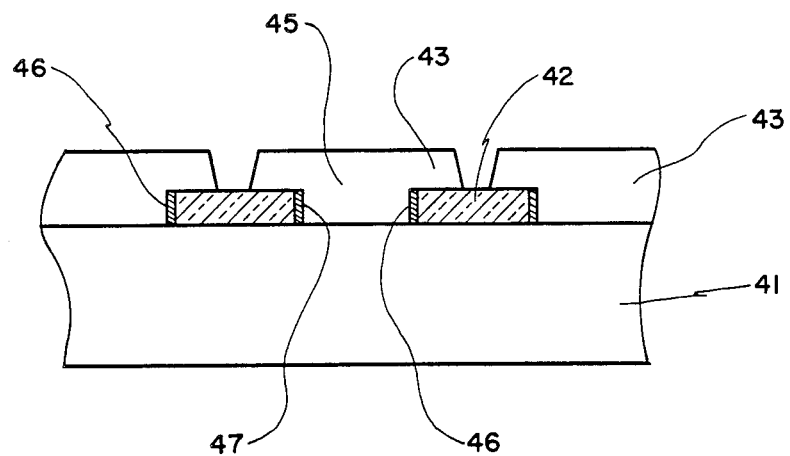
FIG. 6 is a cross-sectional view showing a fourth preferred embodiment of the present invention.

After an aperture 45 has been opened in a silicon dioxide film 42 formed on a silicon single crystal substrate 41, a silicon nitride film 46 is deposited on an inner side surface of the aperture 45 in the silicon dioxide film 42, as shown in FIG. 6. It has been experimentally confirmed that if such a provision is made the aforementioned defect does not occur, when the above-described silicon epitaxial growth is effected. The missing part of the epitaxial layer portion 47 making contact with the lower portion of the inner side surface of the aperture 45 would never occur at all. Therefore, a more preferably silicon epitaxial layer 43 can be grown.

In one method for forming silicon nitride films on only the inner side surfaces of the apertures 45, for instance, after the apertures 45 have been opened in the silicon dioxide film 42, a silicon nitride film is deposited over the entire exposed surface. Subsequently anisotropic etching, for example, reactive ion etching, is effected. A silicon nitride film, in the shape shown in FIG. 6, remains since etching is effected intensely in the vertical direction.

Fifth Preferred Embodiment

The preferred embodiment relates to an IGFET that can be formed by means of the present invention. In general, an IGFET has its source and drain regions formed within a single crystal silicon substrate. Consequently, large junction capacitances are produced by the PN-junctions between these regions and the substrate and hence they prevent an increase in the itching speed. On the other hand, if the SOS technique is used, a leakage current is caused by lattice defects, which becomes a problem. In order to resolve these problems, the prior art includes an IGFET in which an insulating film is selectively formed on a single crystal silicon substrate. A monocrystalline layer is formed on the exposed surface of the single crystal substrate and a polycrystalline layer is provided on the insulating film. Most parts of the source and drain regions are formed in the polycrystalline layer, whereas the channel region is located in the monocrystalline layer.

However, when designing such IGFET's, it is necessary to take into consideration a transitional portion between the monocrystalline layer and the polycrystalline layer. Hence in the case of such IGFET's, the freedom of design is reduced and the application of a miniaturizing technique becomes difficult. Moreover, according to the above-described manufacturing method, the portions of the source and drain regions adjacent to the channel region must be located in the monocrystalline layer. Accordingly, the PN-junctions along the side surfaces of these source and drain regions would extend mostly from the surface of the silicon layer up to the surface of the substrate. As a result, the junction capacitances of these PN-junctions become large.

Figure 7A:
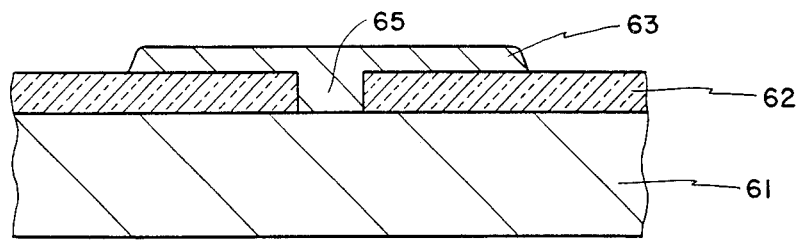
FIGS. 7A to 7D are cross-sectional views showing the successive steps in a manufacturing process according to a fifth preferred embodiment of the present invention.
Figure 7B:
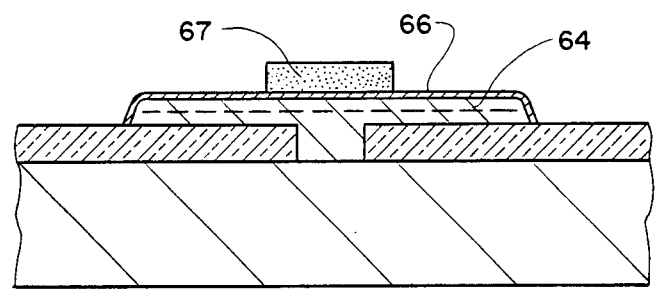
Figure 7C:
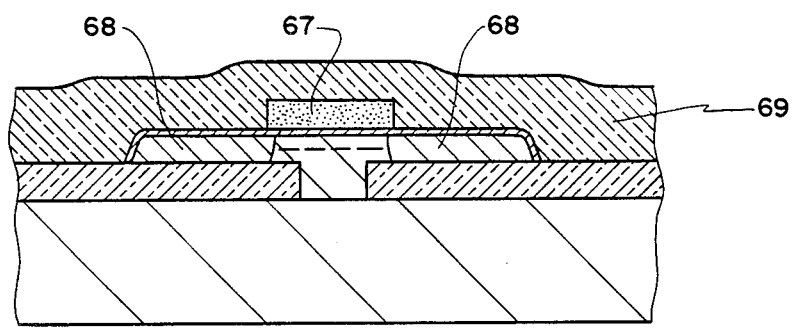
Figure 7D:
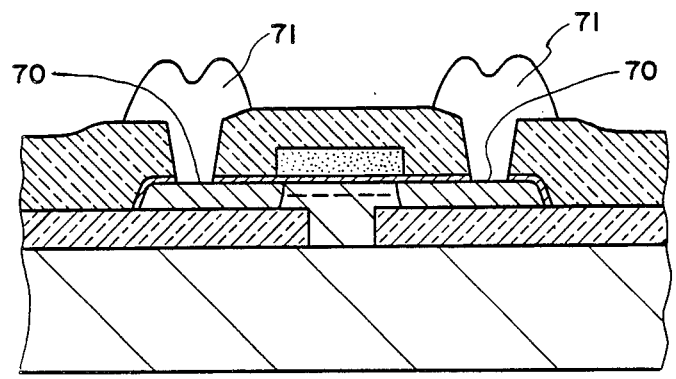
Figure 8A:
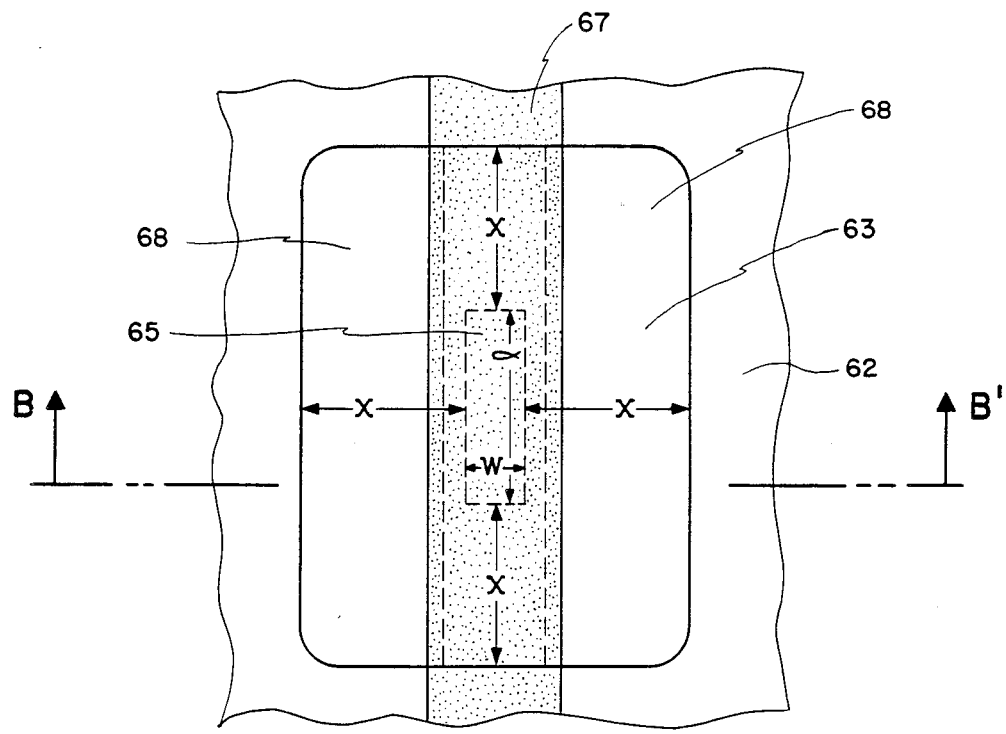
FIG. 8A is a plan view showing the fifth preferred embodiment of the present invention.
Figure 8B:
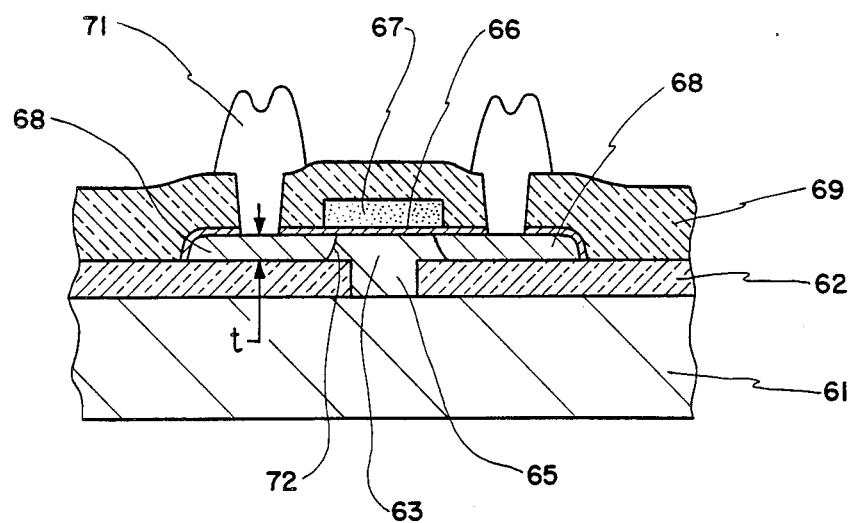
FIG. 8B is a cross-sectional view taken along line B—B' in FIG. 8A as viewed in the direction of arrows.

The IGFET shown in FIG. 8 was produced and overcomes the aforementioned shortcoming through a use of the steps shown in FIGS. 7A to 7D. Since the silicon layer entirely consists of a monocrystalline layer, including the portion on the insulating film, there is no need to take into consideration a transitional portion between a monocrystalline layer and a polycrystalline layer. Moreover, the PN-junctions at the portions of the source and drain regions, which are adjacent the channel region in this IGFET, extends only a small distance from the surface of the silicon layer up to the surface of the insulating layer. The junction capacitances associated with these PN-junctions are reduced to a small value.

Furthermore, in the prior art the above-described polycrystalline layer is formed over the entire surface of the insulating film. Accordingly, it is necessary to provide a means for isolating the respective elements from each other. For instance, it is necessary to remove any unwanted polycrystalline silicon portions or to selectively convert some portions of the polycrystalline silicon layer into insulating isolation layers. To that end, it is necessary to increase the number of mask registration steps. This masking is undesirable in a manufacturing process.

In this respect, according to the method illustrated in FIGS. 7A to 7D, a monocrystalline layer is formed in an island at a predetermined distance from the edge of the insulating film, (that is, only in the element forming region), and not at a location which is further remote from the edge of the insulating film. Accordingly, the above-mentioned means for isolating elements is unnecessary.

In the process shown in FIGS. 7A to 7D, an oxide film 62 of about 5000 Å is formed first on a P-type silicon single crystal substrate 61, having a (100) plane, the formation is through the use of a thermal oxidation process. An aperture 65 is provided therein.

Thereafter, a epitaxial growth is effected at a reduced pressure of about 80 Torr, while maintaining a substrate temperature at 1080° C. Hydrogen is employed as a carrier gas and dichlorosilane ($SiH_2HCl_2$) is employed as a source gas, with a further addition of hydrogen chloride gas and diborane ($B_2H_6$) gas. A flat, smooth $P^-$-type monocrystalline silicon layer 63 is produced on the silicon substrate surface 61 and on a part of the oxide film surface (FIG. 7A). It is to be noted that in FIGS. 7A to 7D, the dimensions in the lateral direction are depicted in an exaggerated manner however, the height dimension between the surface of the insulating film 62 and the surface of the silicon monocrystalline layer 63 is correctly shown as being nearly equal to the lateral dimension between the edge of the aperture 65 and the edge of the layer 63. If it is desirable to make the height dimension smaller than the lateral dimension, then after the silicon monocrystalline layer has been grown, only the height can be cut away by conventional methods.

After a gate oxide film 66 has been formed, an impurity 64 is introduced under control into the surface portion of the substrate. This introduction may be achieved by an ion-implantation process. Thus, a desired threshold voltage of a transistor can be established. Thereafter, a polycrystalline silicon is deposited through a CVD process. When a patterning of a gate electrode 67 has been effected, the structure shown in FIG. 7B is attained. In succession, an N-type impurity (such as arsenic or the like) is doped through ion-implantation at a dose of $10^{15}$ cm$^{-2}$ or more, by employing the gate electrode 67 as a mask, and thus source and drain regions 68 are formed.

Next, a high concentration PSG film 69 is deposited as an inter-layer insulating film, through the use of a CVD process. Then, an appropriate heat treatment achieves a reduction of the resistance of the gate polycrystalline silicon electrode 67 as well as a flattening of the surface, as shown in FIG. 7C.

Subsequently, after contact holes 70 have been formed through the use of a conventional photolithographic technique and etching process, aluminum 71 is deposited through the use of a vacuum vapor deposition process, in order to form a patterning of wiring electrodes. When an alloying between aluminum and silicon has been carried out within a hydrogen atmosphere, the structure shown in FIG. 7D is attained.

If necessary, a passivation film may be deposited through the use of a CVD process, and passivation film portions above electrode pads are removed by making use of a photolithographic technique and an etching process. The performance of a transistor obtained through the above-mentioned process is excellent.

It is to be noted that upon growing the silicon monocrystalline layer, various controls could be made. In the first stage of the growing process a film of, for instance, 0.5 μm thickness is formed while a controlled dose of boron serves as a P-type impurity to make the specific resistance of the epitaxial layer equal to 0.1 Ω.cm. In the second stage of the process of growing a film of, for instance, 0.5 μm thickness, growth occurs while the controlled dose of impurity boron obtains a specific resistance of 10 Ω.cm, and as a whole a silicon epitaxial layer is grown.

FIG. 8 shows an IGFET manufactured through the use of a process shown in FIG. 7. It is to be noted that component parts having the same functions as those shown in FIG. 7 are given like reference numerals. It is also to be noted that in FIG. 8A, the PSG film 69 and the source and drain electrodes 71 are omitted.

The silicon epitaxial layer 63 is depicted in an enlarged scale in the lateral direction only. An aperture 65 is formed in silicon dioxide film 67 with a 2 m width dimension w and 3 μm length dimension 1. A P-type silicon monocrystalline layer 63 is grown within the aperture 65 and on the silicon dioxide film 62, and further extends over it in an island shape. This silicon single crystal layer 63 is formed which is about 1 m to a height t above the silicon dioxide film 62. There is a length x between the edge of the aperture 65 and the edge of the silicon single crystal layer 63 the length X is also about 1 μm.

In addition, a polycrystalline silicon gate electrode 67 (of about 2.5 μm width) extends over a gate oxide film 66. N-type source and drain regions 68, 68 are formed in a self-aligned fashion by making use of the gate electrode 67, as a mask. The PN-junctions 72 formed along the edges of these source and drain regions 68, 68 extend from the surface of the silicon monocrystalline layer 63 and terminate at the surfaces of the silicon dioxide films 62. Therefore, the area of the PN-junctions 72 is small.

Sixth Preferred Embodiment

Figure 9:
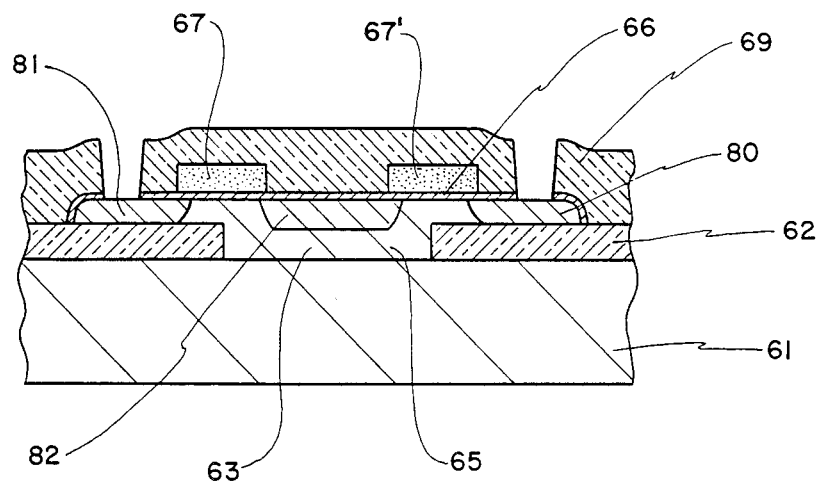
FIG. 9 and 10 are cross-sectional views showing a sixth preferred embodiment of the present invention.
Figure 10:
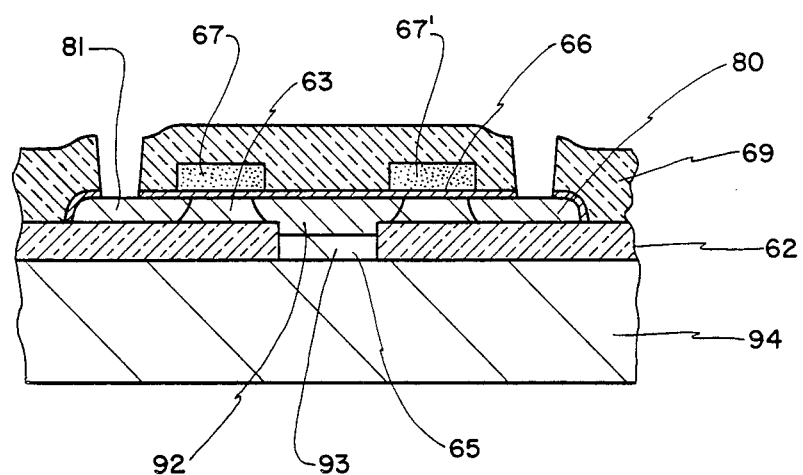

A sixth preferred embodiment of the present invention is illustrated in FIGS. 9 and 10, in which component parts having the same functions as those shown in FIGS. 7 and 8 are given like reference numerals.

The semiconductor device shown in FIG. 9 is manufactured through a process similar to that shown in FIG. 7. An N-type drain region 80 of a first transistor and an N-type drain region 81 of a second transistor are formed in a P-type silicon monocrystalline layer 63. An N-type source region 82, that is common to both transistors, is formed above an aperture 65. Silicon gate electrodes 67 and 67' of the respective transistors are placed between the common source region 82 and the respective drain regions 81 and 80. Since the drain regions to which a voltage is to be applied are located completely on insulating films 62, the junction capacitance is small and hence a punch-through voltage is high. Moreover, since a $P^+$-type silicon single crystal substrate 61 and the P-type silicon monocrystalline layer 65 are connected (and therefore held at the same potential), it is possible to ground or apply a voltage to the semiconductor device through the $P^+$-type silicon single crystal substrate.

In the semiconductor device illustrated in FIG. 10, a P-type silicon monocrystalline layer 63 is formed above an $N^+$-type silicon single crystal substrate 94, but a silicon single crystal portion within the aperture 65 is an N+-type region 93. Also, an N+-type common source region 92 is formed to close the top end of the aperture 65, as shown in FIG. 10. Accordingly, a predetermined potential can be applied to the common source region 92 through the N+-type silicon substrate 94. Hence, there is no need to connect aluminum wiring to the surface of this region 92, and therefore, the degree of integration can be enhanced. Moreover, the region 92 and the region 93 may be provided continuously as a single region.

Seventh Preferred Embodiment

Figure 12:
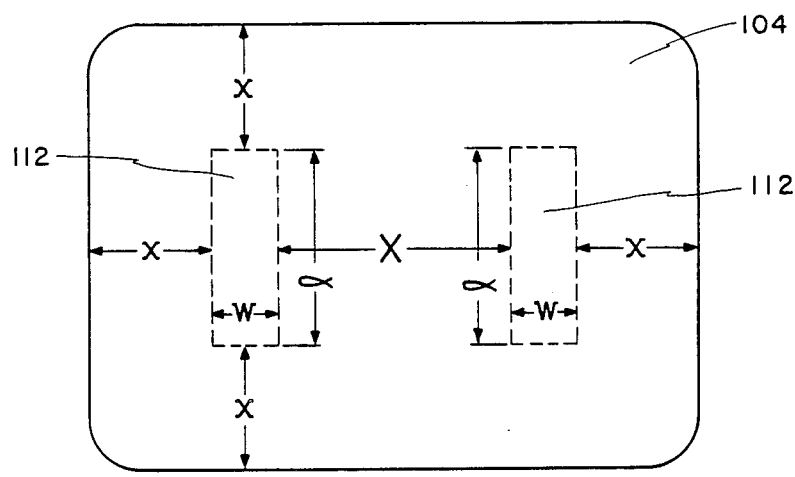
FIG. 12 is a plan view showing apertures and a silicon monocrystalline layer in FIG. 11.
Figure 11:
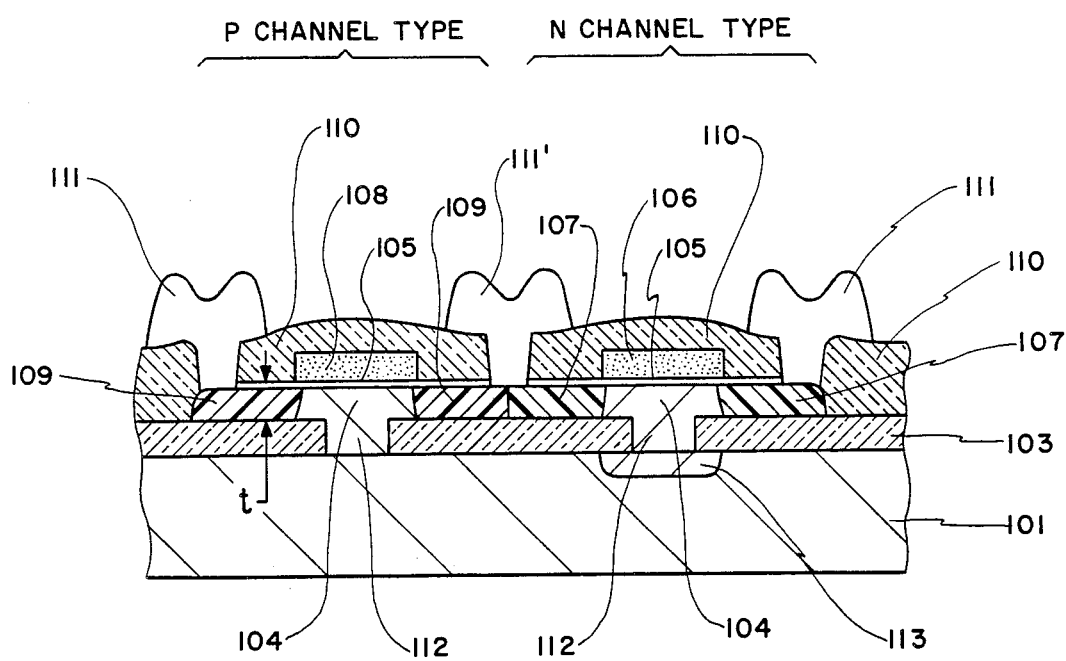
FIGS. 11 and 13 are cross-sectional views showing a seventh preferred embodiment of the present invention.

In this preferred embodiment, the present invention is applied to a CMOS. As shown in FIG. 11, an N-type silicon single crystal substrate 101 has an impurity concentration of $10^{15} \sim 10^{16}$ cm$^{-3}$. A P-type well region 113 has an impurity concentration of $10^{16}$ cm$^{-3}$ and a thermal oxidation film 103. In this thermal oxidation film 103 are formed two apertures 112 of 2 μm width w and 3 μm length l. A distance X, between these two apertures 112, (See FIG. 12) is chosen to be 2 μm. An N-type silicon monocrystalline layer 104 has an impurity concentration of $10^{15}$ cm$^{-3}$ and is grown over the semiconductor structure, through the use of a process according to the present invention, as described previously. A growth continues until height t, as measured from the surface of the thermal oxidation film 103, becomes 1.2 μm. Then, the N-type silicon monocrystalline layer also extends over the thermal oxidation film 103, until an extended distance x (See FIG. 12) becomes 1.2 μm. Therefore, in the region between the two apertures 112, the N-type silicon monocrystalline layers extend from the respective apertures, joined together continuously. It is to be noted that in FIGS. 11 and 12, the dimensions in the lateral direction are depicted in an enlarged scale.

Subsequently, according to the conventional method for manufacturing a CMOS, boron is doped in the region for forming an N-channel type transistor to convert the N-type silicon monocrystalline layer 104 into a P-type silicon monocrystalline layer having an impurity concentration of $10^{16}$ cm$^{-3}$. Then, a gate insulating film 105 is formed over the silicon monocrystalline layer, and N-type source and drain regions 109 of the P-channel type transistor are formed by employing a silicon gate electrode 108 as a mask. The P-type source and drain regions 107 of the N-channel type transistor are formed by employing a silicon gate electrode 106 as a mask. Then a PSG film 110 is deposited over the semiconductor chip, and apertures are opened in the PSG film 110 to connect aluminum electrodes 111 and 111' to the respective source and drain regions.

A CMOS having the above-mentioned construction is excellent with respect to a reduction of junction capacitance and improvements in punch-through voltage for the same reasons that are explained previously in connection with the fourth preferred embodiment. Moreover, it is possible to apply a power supply voltage $V_{DD}$ by connecting the electrode 111 of the P-channel type transistor to the N-type substrate 101, or to supply a power supply voltage $V_{SS}$ by connecting the electrode 111 of the N-channel type transistor to the P-type well 113. Therefore, the wiring contacts on the top surface is unnecessary. A higher degree of circuit integration can be realized as compared to a CMOS of the SOS type. Normally, the width w of the apertures 112 formed in the insulating film 103 is 0.5 ~ 5 μm; the distance X between the adjacent apertures 112 is 1 ~ 4 μm; the thickness of the insulating film 103 is 0.5 ~ 2 μm; the thickness of the silicon monocrystalline layer 104 on the insulating film 103 is 0.5 ~ 2 μm; and the distance x over which the silicon monocrystalline layer extends from the edge of the aperture 112 is 0.5 ~ 2 μm. In any event, the condition of $t \approx x \geq (X/2)$ must be fulfilled.

Figure 13:
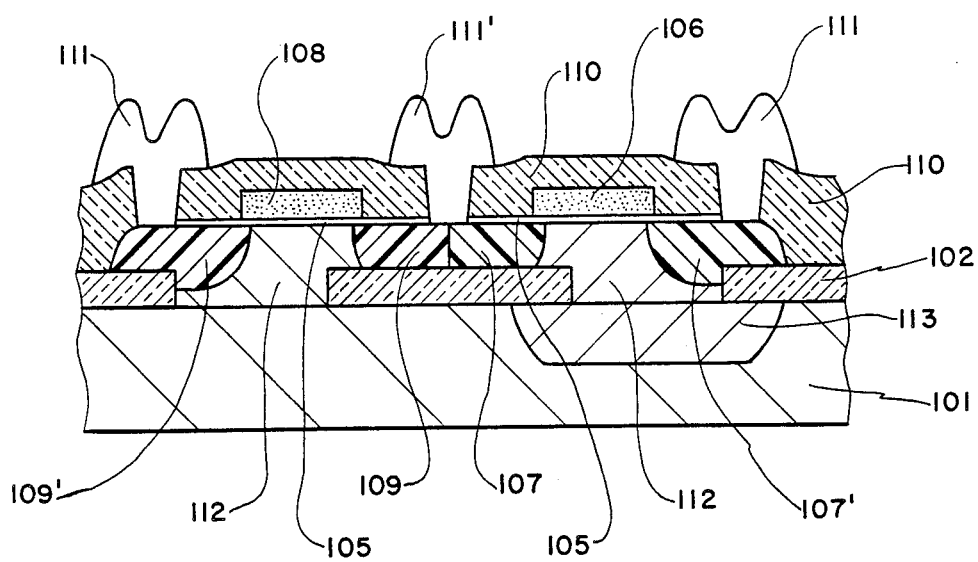

A CMOS illustrated in FIG. 13 is similar to the CMOS shown in FIG. 11. The only difference is that a source or drain region 109' of a P-channel type transistor and a source or drain region 107' of an N-channel type transistor are provided to extend into the respective apertures 112. In some cases, even that construction can be also employed.

Eighth Preferred Embodiment

Figure 14:
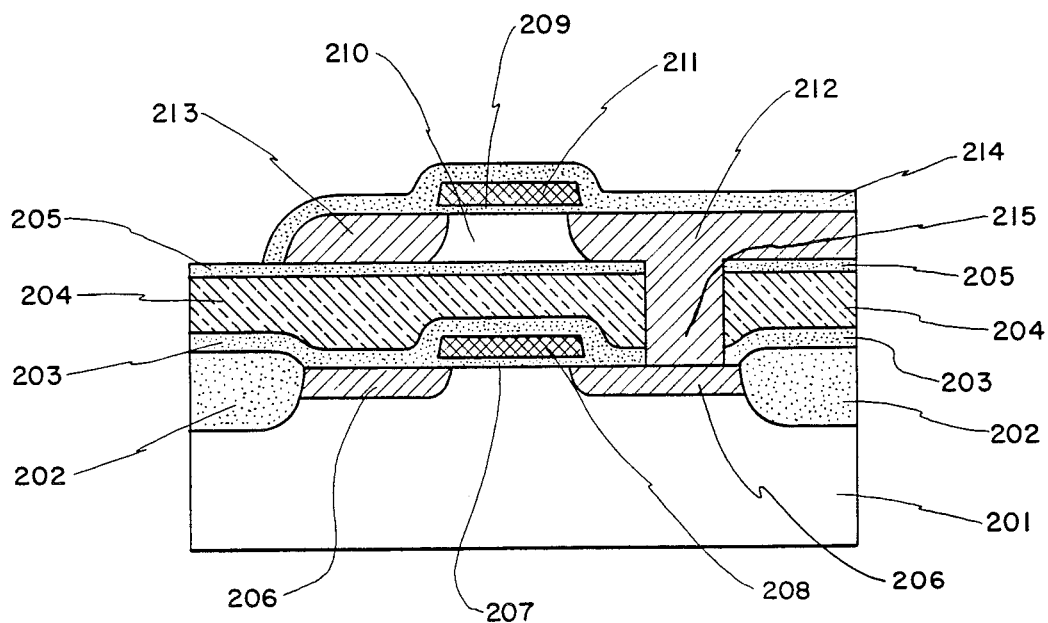
FIG. 14 is a cross-sectional view showing an eighth preferred embodiment of the present invention.

This embodiment relates to a semiconductor integrated circuit in which two IGFET's are stacked in two stairs as shown in FIG. 14. An active region is surrounded by a field insulating film 202 which is partially buried in a P-type silicon single crystal substrate 201. Within this region are formed N-type source and drain regions 206 by making use of a silicon gate electrode 208 on a gate insulating film 207 as a mask. Over the entire surface of the above-mentioned semiconductor chip are formed a silicon dioxide film 203 containing almost no impurity and a phosphosilicate glass film (PSG film) 204. Further, a silicon dioxide film or a silicon nitride film 205 is formed thereon. An aperture 215, reaching the source or drain region 206, is opened through these films 203, 204 and 205. Then, epitaxial growth is effected under a reduced pressure by making use of the exposed single crystal surface (the surface of the source of drain region 206) as a seed crystal. A diborane ($B_2H_6$) gas and dichlorosilane ($SiH_2Cl_2$) are employed as a source, as diluted by hydrogen and added with hydrogen chloride. A P-type silicon single crystal layer 210 is thus grown within the aperture 215 and on the insulating film 205.

In this embodiment, the P-type silicon monocrystalline layer 210 is grown a height of 3 μm above the surface of the insulating film 205. Layer 210 also extends in the lateral direction by a distance of 3 μm. Next, anisotropic plasma etching is effected in the vertical direction, and the thickness of the silicon monocrystalline layer 210 is thereby reduced to 1 μm. Then, N-type source and drain regions 212 and 213 are formed by making use of a silicon gate electrode 211 on a gate insulating film 209 as a mask. The N-type region 212 reaches to the region 206 formed in the substrates. Subsequently a passivation film 214 is formed over the entire surface, to complete the formation of an up-stair IGFET.

As described above, the present invention is also applicable to the so-called three-dimensional device. In addition, since a phosphosilicate glass film 204 is provided, the surface of the device is smoothed through a high-temperature treatment. Because the silicon monocrystalline layer 210 is formed on a surface having an excellent flatness, it has a better crystallinity. The upstair IGFET formed on the surface has excellent performance.

Ninth Preferred Embodiment

Figure 15:
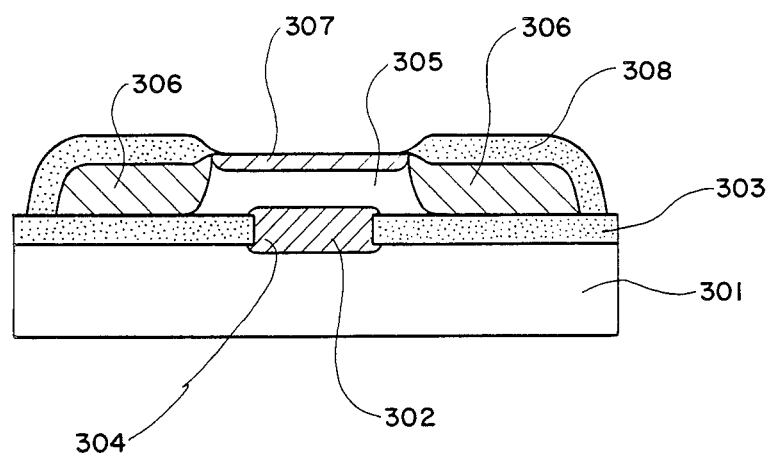
FIG. 15 is a cross-sectional view showing a nineth preferred embodiment of the present invention.

This embodiment relates to an application of the present invention to a junction type field effect transistor. As shown in FIG. 15, a thermal oxidation film 303 is formed in a silicon single crystal substrate 301. An aperture 304 is opened in the thermal oxidation film 303, at a location where a gate is to be formed. Then, an epitaxial growth is effected at a reduced pressure of 80 Torr, while maintaining a substrate temperature at 1000° C. A gas used during expitaxial growth is prepared by diluting a $SiH_2Cl_2$ gas with hydrogen and mixing hydrogen chloride with the combination. In the first step of this epitaxial growth, diborane ($B_2H_6$) gas is added to form a P-type silicon monocrystalline layer 302 having the specific resistance of 10 Ω cm. In the second step, phosphine ($PH_3$) gas is added to form an N-type silicon monocrystalline layer 305. Next, an N-type impurity is doped through the use of a conventional process. N+-type source and drain regions 306 are formed, and then an oxide film 308 is formed on the surface of the regions 306 and a P-type gate region 307. In such a transistor, the source and drain regions 306 are isolated from the silicon single crystal substrate, and the load capacitance is reduced so that a high speed operation becomes possible. In addition, since the active region is formed in an island shape, a leakage current can be suppressed.

Tenth Preferred Embodiment

Figure 16:
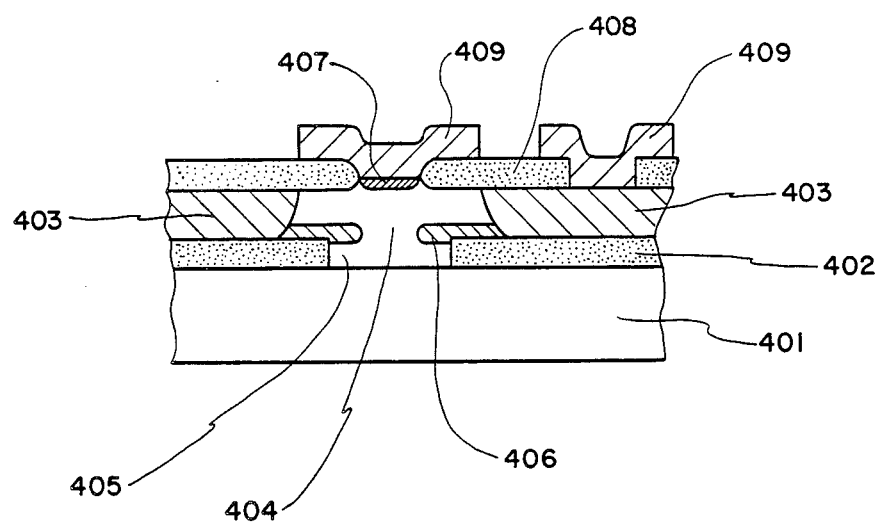
FIG. 16 is a cross-sectional view showing a tenth preferred embodiment of the present invention.

This embodiment also relates to an application of the present invention to a junction type field effect transistor. As shown in FIG. 16, an insulating film 402 is formed on an N-type silicon single crystal substrate 401. This insulating film is opened to form an aperture 405 at a location where a channel portion of a transistor is to be located. Next, an epitaxial growth is effected at a reduced pressure of 80 Torr while maintaining a substrate temperature at 1000° C., by passing hydrogen at a flow rate of 100 l/min., $SiH_2Cl_2$ at a flow rate of 500 cc/min., and hydrogen chloride at a flow rate of 1.5 l/min., and by a further mixing of phosphine ($PH_3$) therewith. An N-type silicon monocrystalline layer 404 is formed in an island shape extends from within the aperture 405 onto the insulating film 402, is formed. Then, in this N-type silicon monocrystalline layer 404 are formed P-type impurity regions 406 and N+-type source and drain regions 403 through the use of an ion implantation process. Thereafter, a thermal oxidation film 408 is deposited over the entire surface. An aperture is opened in the thermal oxidation film 408, and a P-type impurity region 407 is formed in the aperture. An electrode 409 is connected to the impurity region 407. In such a transistor construction. Parasitic capacitance is reduced and high-speed operation is possible since the source and drain regions are isolated from the silicon single crystal substrate. In addition, the active region is formed in an island shape to suppress a leakage current.

What is claimed is:

1. A method of manufacturing a semiconductor device comprising the steps of preparing a single crystal silicon substrate having a major surface with an insulating film formed thereon, at least one aperture selectively formed in said film, said insulating film including a silicon dioxide film and a silicon nitride film deposited on the side surface of said aperture formed in said silicon dioxide film, setting said single crystal silicon substrate within a chamber, and growing a silicon monocrystalline layer extending from the portion of said single crystal silicon substrate which is within said aperture, said grown layer extending onto said insulating film, said layer being grown by making dichlorosilane, hydrogen chloride, and a carrier gas flow into said chamber and by reacting them under a reduced gas pressure.

2. The method of manufacturing a semiconductor device as claimed in claim 1, in which said silicon monocrystalline layer is grown while maintaining a substrate temperature at 850° to 1100° C.

3. The method of manufacturing a semiconductor device as claimed in claim 1, in which said silicon monocrystalline layer is grown at a reduced pressure of 1 to 200 Torr.

4. The method of manufacturing a semiconductor device as claimed in claim 1, in which the gas flowing into said chamber includes 0.05 to 1.0 mol.% dichlorosilane, 0.05 to 3.0 mol.% hydrogen chloride and a carrier gas.

5. The method of manufacturing a semiconductor device as claimed in claim 1, in which said silicon monocrystalline layer is grown to a height of 0.5 to 4 μm from the surface of said insulating film, the distance from the edge of said aperture to the outer edge of the silicon monocrystalline layer being 0.5 to 4 μm.

6. The method of manufacturing a semiconductor device as claimed in claim 1, in which a plurality of apertures are formed in said insulating film, and said silicon monocrystalline layer is grown so that it forms a continuous layer on the insulating film portion between the adjacent apertures.

7. The method of manufacturing a semiconductor device as claimed in claim 1, in which said aperture formed in the insulated film includes a lower portion adjacent said silicon single crystal substrate and an upper portion having an area which is larger than the area of said lower portion, and said silicon monocrystalline layer is grown so that the surface of said silicon monocrystalline layer and the surface of the insulating film becomes substantially co-planar with each other.

* * * * *